United States Patent
Dai et al.

(10) Patent No.: US 12,300,337 B2
(45) Date of Patent: May 13, 2025

(54) MEMORY REPAIR SYSTEM AND METHOD

(71) Applicant: QUALCOMM INCORPORATED, San Diego, CA (US)

(72) Inventors: Hong Dai, San Diego, CA (US); Amir Borovietzky, San Diego, CA (US); Arvind Jain, San Diego, CA (US); Massine Bitam, Cork (IE); Madan Krishnappa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 297 days.

(21) Appl. No.: 17/944,691

(22) Filed: Sep. 14, 2022

(65) Prior Publication Data

US 2024/0087662 A1 Mar. 14, 2024

(51) Int. Cl.
*G11C 29/32* (2006.01)
*G01R 31/319* (2006.01)
*G11C 29/44* (2006.01)

(52) U.S. Cl.
CPC ........ *G11C 29/32* (2013.01); *G01R 31/31926* (2013.01); *G11C 29/44* (2013.01)

(58) Field of Classification Search
CPC ....... G11C 29/32; G11C 29/44; G11C 29/787; G11C 29/789; G11C 29/14; G11C 2029/4402; G01R 31/31926
See application file for complete search history.

(56) References Cited

U.S. PATENT DOCUMENTS

| | | | |
|---|---|---|---|
| 2006/0233011 A1 | 10/2006 | Matsuoka et al. | |
| 2008/0091988 A1* | 4/2008 | Yoel | G11C 29/44 |
| | | | 714/E11.054 |
| 2011/0029813 A1* | 2/2011 | Gunderson | G11C 29/802 |
| | | | 714/E11.02 |
| 2013/0275821 A1 | 10/2013 | Braceras et al. | |
| 2016/0035438 A1 | 2/2016 | Kim | |
| 2016/0078968 A1 | 3/2016 | Park et al. | |
| 2017/0184662 A1 | 6/2017 | Varadarajan et al. | |
| 2021/0333323 A1* | 10/2021 | Mondello | G06F 3/0655 |

OTHER PUBLICATIONS

International Search Report and Written Opinion—PCT/US2023/029104—ISA/EPO—Dec. 13, 2023.

* cited by examiner

*Primary Examiner* — Uyen Smet
(74) *Attorney, Agent, or Firm* — Smith Tempel Blaha LLC/Qualcomm

(57) ABSTRACT

A system for repairing a random access memory may include serial test interface logic, fuse-sense logic, a repair data register chain, and multiplexing logic. The repair data register chain may include serially interconnected data registers configured to shift data through the repair data register chain. Each data register of the repair data register chain may have a data output configured to be coupled to a repair information input of the random access memory. The multiplexing logic may be configured to provide a soft-repair mode and a hard-repair mode. When the soft-repair mode is selected, the multiplexing logic may be configured to receive soft-repair data provided by the serial test interface logic into the data registers. When the hard-repair mode is selected, the multiplexing logic may be configured to receive the data provided by the fuse-sense logic into the data registers.

26 Claims, 10 Drawing Sheets

MEMORY REPAIR SYSTEM AND METHOD

DESCRIPTION OF THE RELATED ART

Memory devices, such as dynamic random access memories ("DRAMs"), may be included in a wide variety of computing devices. In a computing device, a memory device may be included in, or otherwise coupled to, a chip containing one or more processing systems. A system-on-a-chip or "SoC" is one such chip that integrates numerous components to provide system-level functionality. For example, an SoC may include one or more types of processors, such as central processing units ("CPU"s), graphics processing units ("GPU"s), digital signal processors ("DSP"s), and neural processing units ("NPU"s). An SoC may include other processing subsystems, such as a transceiver or "modem" subsystem that provides wireless connectivity.

In a memory device, storage array cells may have manufacturing defects that prevent the cells from storing data properly. A memory device may be tested after manufacturing to reveal any such defects. Techniques have been developed for repairing a storage array having defective cells. The memory device may include spare rows or columns that can be substituted for any defective rows or columns. A first type of repair using spare rows or columns may be referred to as a "soft repair." A second type of repair using spare rows or columns may be referred to as a "hard repair."

A soft repair method may use the serial test interface specified by the Joint Test Action Group ("JTAG"). Through the JTAG interface, repair information may be serially loaded into a chain of JTAG data registers in, for example, an SoC or other chip to which the memory device is coupled or in which the memory device is integrated. The repair information thus stored in the JTAG data registers is used by the memory device to control the substitution of defective rows or columns of the storage array with spare rows or columns.

A hard repair method may use a programmable read-only memory ("PROM") to store repair information. The PROM cells may be referred to as fuses. The PROM and associated repair logic, such as fuse-sense control logic and fuse-sense registers, may be included in an SoC or other chip to which the memory device is coupled or in which the memory device is integrated. Hard repair may be performed when a computing device is powered up or otherwise restarted in preparation for use. When the computing device is powered up or restarted, the fuse-sense control logic may serially load the repair information into the fuse-sense registers (i.e., flip-flops). The repair information thus stored in the fuse-sense registers is accessed and used by the memory device to control the substitution of defective rows or columns of the storage array with spare rows or columns.

An SoC or similar chip may include both soft-repair logic and hard-repair logic. Multiplexing circuitry may be included to couple either the fuse-sense registers or the JTAG data registers to the memory device. Such combined soft-repair and hard-repair logic may include several thousand JTAG data registers for soft repair and several thousand fuse-sense registers for hard repair.

SUMMARY OF THE DISCLOSURE

Systems, methods and other examples are disclosed for repairing a random access memory. An exemplary system for repairing a random access memory may include serial test interface logic, fuse-sense logic, a repair data register chain, and multiplexing logic. The repair data register chain may include a plurality of serially interconnected data registers configured to shift data serially through the repair data register chain. Each data register of the repair data register chain may have a data output configured to be coupled to a repair information input of the random access memory. The multiplexing logic may be configured to provide a soft-repair mode and a hard-repair mode. When the soft-repair mode is selected, the multiplexing logic may be configured to receive soft-repair data provided by the serial test interface logic into the data registers. When the hard-repair mode is selected, the multiplexing logic may be configured to receive the data provided by the fuse-sense logic into the data registers.

An exemplary method for repairing a random access memory may include receiving a mode selection signal indicating a soft-repair mode or a hard-repair mode. The method may further include reading soft-repair data from serial test interface logic into a repair data register chain via multiplexing logic in response to the mode selection signal indicating the soft-repair mode. The method may still further include reading hard-repair data from fuse-sense logic into the repair data register chain via the multiplexing logic in response to the mode selection signal indicating the hard-repair mode. The method may also include providing repair data from the outputs of the data registers to a repair information input of the random access memory.

Another exemplary system for repairing a random access memory may include means for receiving a mode selection signal indicating a soft-repair mode or a hard-repair mode. The system may further include means for reading soft-repair data from serial test interface logic into a repair data register chain via multiplexing logic in response to the mode selection signal indicating the soft-repair mode. The system may still further include means for reading hard-repair data from fuse-sense logic into the repair data register chain via the multiplexing logic in response to the mode selection signal indicating the hard-repair mode. The system may also include means for providing repair data from the outputs of the data registers to a repair information input of the random access memory.

An exemplary system-on-a-chip (SoC) may include a system for repairing a random access memory. The SoC may include fuse-sense logic, serial test interface logic, a repair data register chain, and multiplexing logic. The serial test interface logic may comprise JTAG logic. The repair data register chain may comprise a plurality of serially interconnected data registers configured to shift data serially through the repair data register chain. Each data register of the repair data register chain may have a data output configured to be coupled to a repair information input of the random access memory. The multiplexing logic may be configured to provide a soft-repair mode and a hard-repair mode. When the soft-repair mode is selected, the multiplexing logic may be configured to receive soft-repair data provided by the serial test interface logic into the data registers. When the hard-repair mode is selected, the multiplexing logic may be configured to receive the data provided by the fuse-sense logic into the data registers.

BRIEF DESCRIPTION OF THE DRAWINGS

In the Figures, like reference numerals refer to like parts throughout the various views unless otherwise indicated. For reference numerals with letter character designations such as "101A" or "101B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects.

Figure 1:
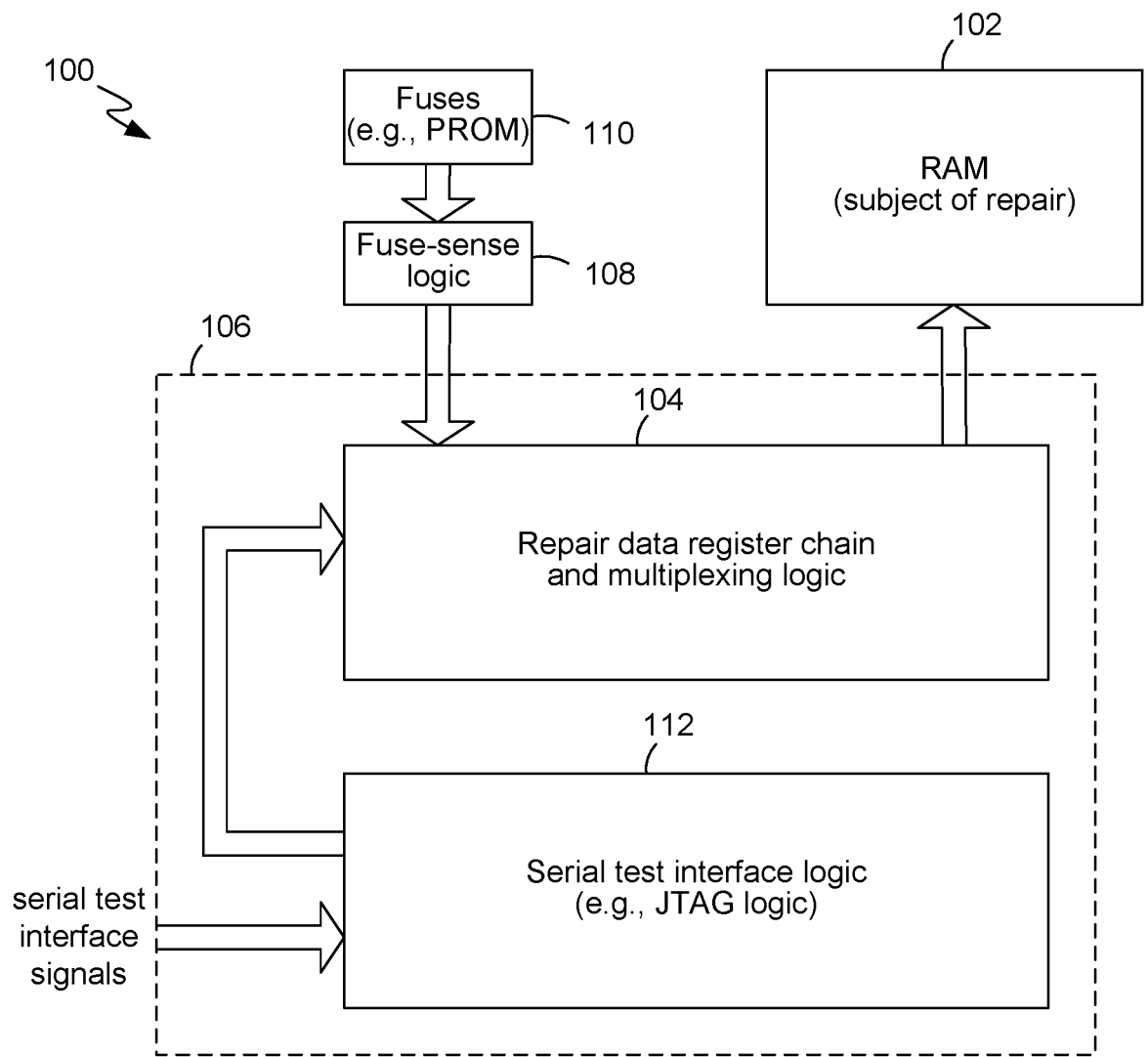
FIG. 1 is a block diagram of a memory repair system, in accordance with exemplary embodiments.

As shown in FIG. 1, in an illustrative or exemplary embodiment a memory repair system 100 for repairing a random access memory ("RAM") 102 may include a repair data register chain and multiplexing logic 104. The RAM 102 may be of any type that includes features for repairing its storage array by substituting spare rows or columns based on repair information that the RAM 102 may receive. The format of such repair information and the manner in which the RAM 102 may receive and use the repair information are well understood by one of ordinary skill in the art. Accordingly, such aspects are not described herein. The RAM 102 may be, for example, a double data rate synchronous dynamic RAM ("DDR-SDRAM"). The repair data register chain and multiplexing logic 104 may be included in a system-on-a-chip ("SoC") 106. Although not shown in FIG. 1, the SoC 106 may include numerous other components, such as processors and subsystems, interconnected by data communication buses, etc.

The memory repair system 100 may also include fuse-sense logic 108. The fuse-sense logic 108 may be configured to read the states of fuses or cells of a read-only memory ("ROM") 110, which may be referred to as a fuse ROM. The fuse ROM 110 may be a programmable ROM ("PROM"). As the fuse-sense logic 108 and the fuse ROM 110 are well understood in the art, they are not described in further detail herein. It may be noted that the fuse ROM 110 contains or stores repair information, and that providing repair information from the fuse ROM 110 to the repair information inputs of the RAM 102 may be referred to as "hard repair."

The memory repair system 100 may further include serial test interface logic 112. The serial test interface logic 112 may also be included in the SoC 106. Although in the illustrated embodiment the RAM 102, fuse-sense logic 108 and fuse ROM 110 are shown as separate components coupled to the SoC 106 (i.e., external to the SoC 106), in other embodiments one or more such components may be included in such an SoC along with the serial test interface logic 112 and the repair data register chain and multiplexing logic 104. The serial test interface logic 106 may be used not only for testing the logic components of the SoC 106 but also for providing soft-repair data or information to the RAM 102. Although not shown for purposes of clarity, the serial test interface logic 112 may be coupled to SoC pins, pads, etc., through which signals may be communicated between the serial test interface logic 112 and equipment external to the SoC 106. An example of the serial test interface logic 106 is logic in accordance with specifications promulgated by the Joint Test Action Group ("JTAG"). Although such JTAG logic is well understood by one of ordinary skill in the art, some aspects may be provided as described below with regard to FIG. 2. Providing repair information from JTAG logic or other serial test interface logic 112 to the repair information inputs of the RAM 102 may be referred to as "soft repair."

Soft repair may be performed at any time. For example, soft repair may be performed during post-manufacture testing of a computing device (not shown in FIG. 1) or portion thereof containing the SoC 106 and the RAM 102. As understood by one of ordinary skill in the art, soft repair may be employed to confirm the validity of repair information in anticipation of using essentially the same repair information to perform hard repair of the RAM 102. Soft-repair information (i.e., row/column substitutions) confirmed through soft repair methods to result in proper operation of the RAM 102 may then be translated into corresponding hard repair information.

Hard repair may be performed, for example, at the beginning or startup of the normal operational mode or "mission mode" of a computing device (not shown) in which the SoC 106 (including the system 100) is included. For example, during a startup (e.g., power-on, reset, etc.) process in a smartphone, the hard repair information may be transferred from the fuse ROM 110 to the RAM 102 via the repair data register chain and multiplexing logic 104 and used to maintain the RAM 102 in a repaired state during the course of mission mode operation of the smartphone by a user.

Whether the repair data register chain and multiplexing logic 104 operates in a hard-repair mode or a soft-repair mode may be selectable (e.g., based on control signals, as described below). Multiplexing features of the repair data register chain and multiplexing logic 104 may be configured to select data paths based on whether the soft-repair mode or the hard-repair mode is selected. That is, such multiplexing features may be configured to receive via certain data paths soft-repair data provided by the serial test interface logic 112 into a repair data register chain (described in further detail below) when the soft-repair mode is selected, and to receive via other data paths hard-repair data provided by the fuse-sense logic 108 when the hard-repair mode is selected.

Figure 2:
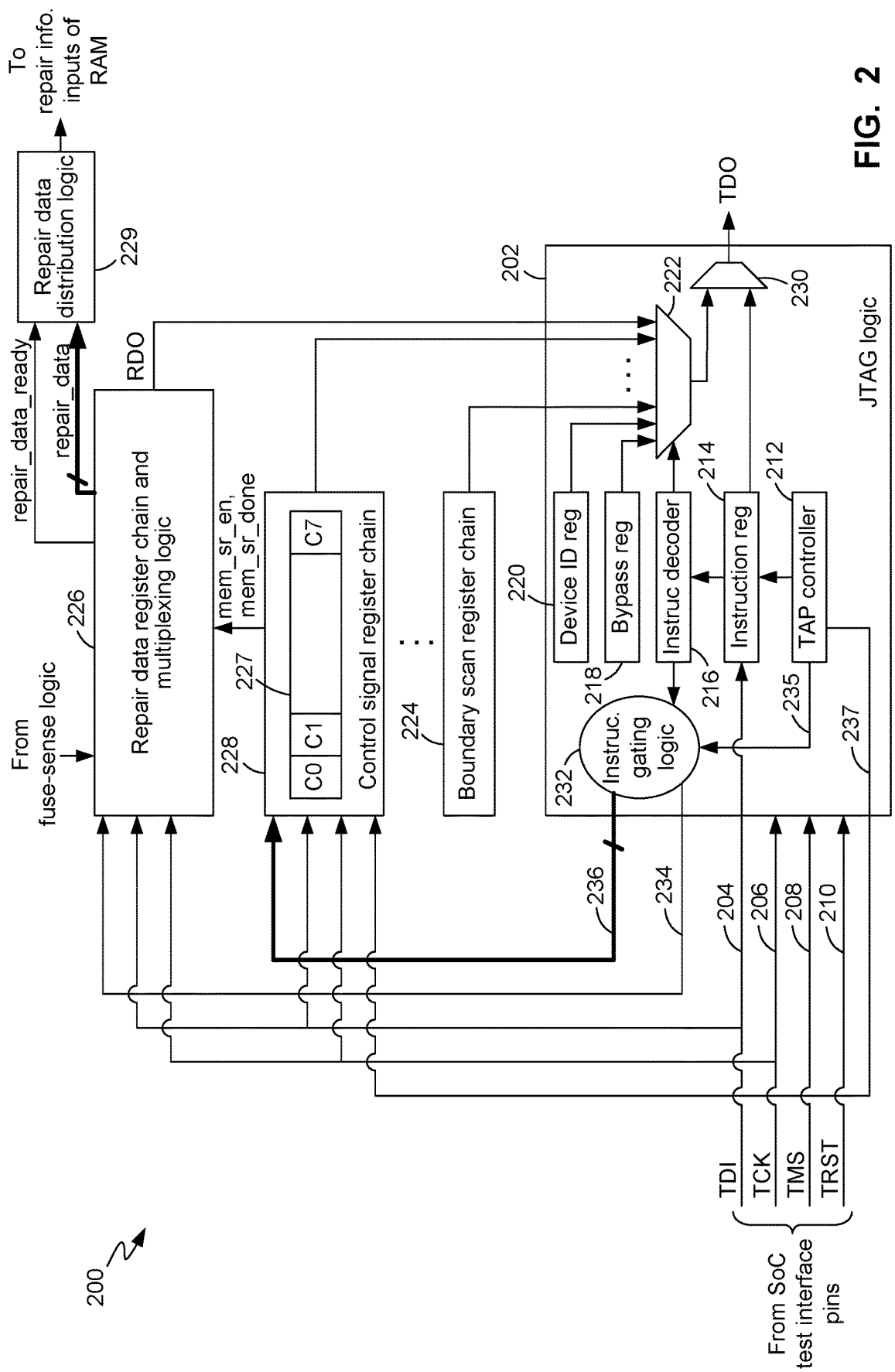
FIG. 2 is a block diagram of another memory repair system, in accordance with exemplary embodiments.

In FIG. 2, a memory repair system 200 may include JTAG logic 202. The system 200 may be an example of a portion of the above-described system 100 (FIG. 1), and the JTAG logic 202 may be an example of the above-described serial test interface logic 106. As understood by one of ordinary skill in the art, the JTAG logic 202 may receive the following JTAG test signals through a test access port or "TAP": a Test Data In ("TDI") signal on a TDI signal input 204; a Test Clock ("TCK") signal on TCK signal input 206, a Test Mode Select ("TMS") signal on a TMS signal input 208, and a Test Reset ("TRST") signal on a TRST signal input 210. The JTAG logic 202 may include a TAP controller 212 (e.g., a finite state machine), an instruction register 214, an instruction decoder 216, a bypass register 218, and a device ID register 220. The TAP controller 212 may control receiving data via the TDI signal path 204, loading the various registers, and other functions. For example, the instruction register 214 may be loaded with instructions received via the TDI signal path 204. The instruction decoder 216 is configured to decode instructions in the instruction register 214. As understood by one of ordinary skill in the art, the data received serially via the TDI signal path 204 may represent not only test data but also instructions that are involved in controlling the JTAG logic 202. As the TAP controller 212 and its usage via the JTAG logic 202 are well understood by one of ordinary skill in the art, such aspects are not described in detail herein.

The system 200 may also include a repair data register chain and multiplexing logic 226, a control signal register chain 228, a boundary scan register chain 224, and any number of other JTAG data register chains (not shown but indicated by the ellipsis symbol (" . . . ")). The boundary scan register chain 224 is not relevant to the solutions described herein but is shown for completeness, as it is commonly included in systems having such JTAG logic. The control signal register chain 228 may comprise a number of JTAG data registers ("JDRs") 227. For example, the control signal register chain 228 may comprise eight JDRs 227, each configured to receive and store one of eight corresponding control bits "C0"-"C7". The control signal register chain 228 is further described below. The repair data register chain and multiplexing logic 226 and the control signal register chain 228 may receive the TDI and TCK signals. The control signal register chain may provide at least two of the aforementioned control bits to the repair data register chain and multiplexing logic 226: a soft-repair enable signal (which may be referred to below as mem_sr_en) and a soft-repair done signal (which may be referred to below as mem_sr_done).

The JTAG logic 202 may further include repair data distribution logic 229. The repair data distribution logic 229 may be configured to provide repair data to the repair information inputs of a RAM (not shown in FIG. 2). The repair data distribution logic 229 may be configured to receive the repair data from the repair data register chain and multiplexing logic 226 and to provide the repair data to the repair information inputs of the RAM in response to a repair_data_ready signal received from the repair data register chain and multiplexing logic 226.

The JTAG logic 202 may also include a multiplexer ("MUX") 222 that selects from among its inputs based on the output of the instruction decoder 216. One of the selectable inputs of the MUX 222 may be coupled to the output of the repair data register chain and multiplexing logic 226. The repair data register chain and multiplexing logic 226 may be an example of the above-described repair data register chain and multiplexing logic 104 (FIG. 1). Yet another of the selectable inputs of the MUX 222 may be coupled to the output of a control signal register chain 228. Another of the selectable inputs of the MUX 22 may be coupled to the output of the boundary scan register chain 224. Still others of the selectable inputs of the MUX 222 may be coupled to the bypass register 218, the device ID register 220 or other registers (not shown) of the JTAG logic 202. The output of the MUX 222 may be provided to an input of another MUX 230, which may be configured to select between that input and a second input coupled to the instruction register 214. The output of the MUX 230 may provide the Test Data Out ("TDO") JTAG signal through the TAP. The TDO JTAG signal may be used in the context of the memory repair system 200 to read back data from the above-referenced registers for verification.

The JTAG logic 202 may also include instruction gating logic 232 configured to decode signals provided by the instruction decoder 216 as a result of decoding instructions. The instruction gating logic 232 may provide a data bit shift signal (which may be referred to below as mem_sr_data_shift) to the repair data register chain and multiplexing logic 226 via a signal path 234. The instruction gating logic 232 may also provide the following signals to the control signal register chain 228 via a signal path 236: a control bit shift signal (which may be referred to below as mem_sr_ctrl_shift), a read-or-hold select signal (which may be referred to below as mem_sr_ctrl_bsen), and a control bit update signal (which may be referred to below as mem_sr_ctrl_update). The TAP controller 212 may provide JTAG signals commonly referred to as capture_DR, shift_DR and update_DR to the instruction gating logic 232 via a signal path 235. Via a signal path 237, the TAP controller 212 may provide a JTAG reset signal (which may be referred to below as jtag_reset) to the repair data register chain and multiplexing logic 226 and the control signal register chain 228. The instruction gating logic 232 may be configured to produce the mem_sr_data_shift signal using the following operations: shift_DR & INST(mem_sr_data), where the ampersand symbol ("&") represents a logical-AND operation, and INST is the decoding function of the instruction decoder 216, where the instruction is mem_sr_data. The instruction gating logic 232 may be configured to produce the mem_sr_ctrl_shift signal using the following operations: shift_DR & INST(mem_sr_ctrl). The instruction gating logic 232 may be configured to produce the mem_sr_ctrl_bsen signal using the following operations: (capture_DR|shift-DR) & INST(mem_sr_ctrl), where the vertical line symbol ("|") represents a logical-OR operation. The instruction gating logic 232 may be configured to produce the mem_sr_ctrl_update signal using the following operations: update_DR & INST(mem_sr_ctrl).

Figure 3A:
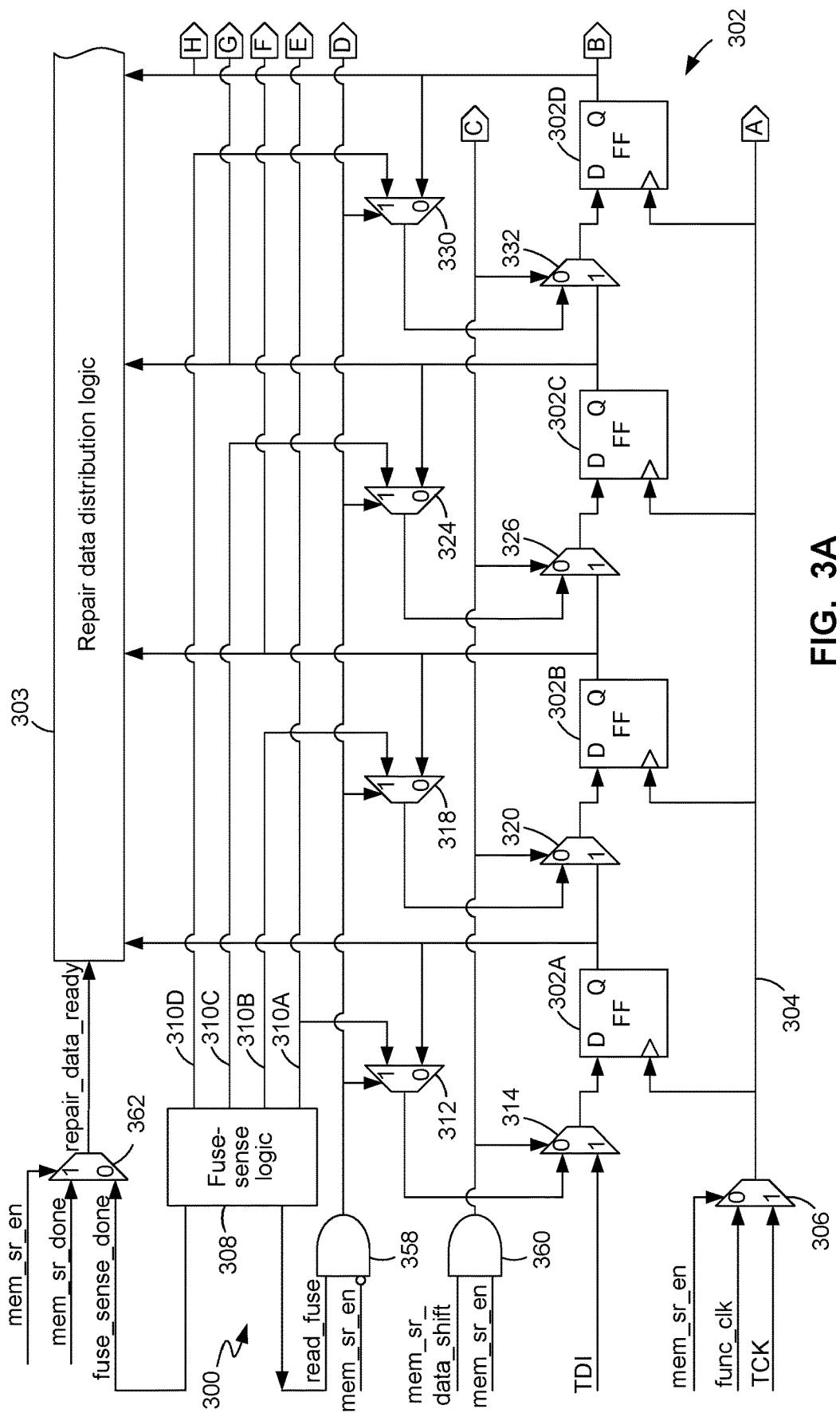
FIG. 3A is a block diagram of a repair data register chain and associated logic, in accordance with exemplary embodiments.
Figure 3B:
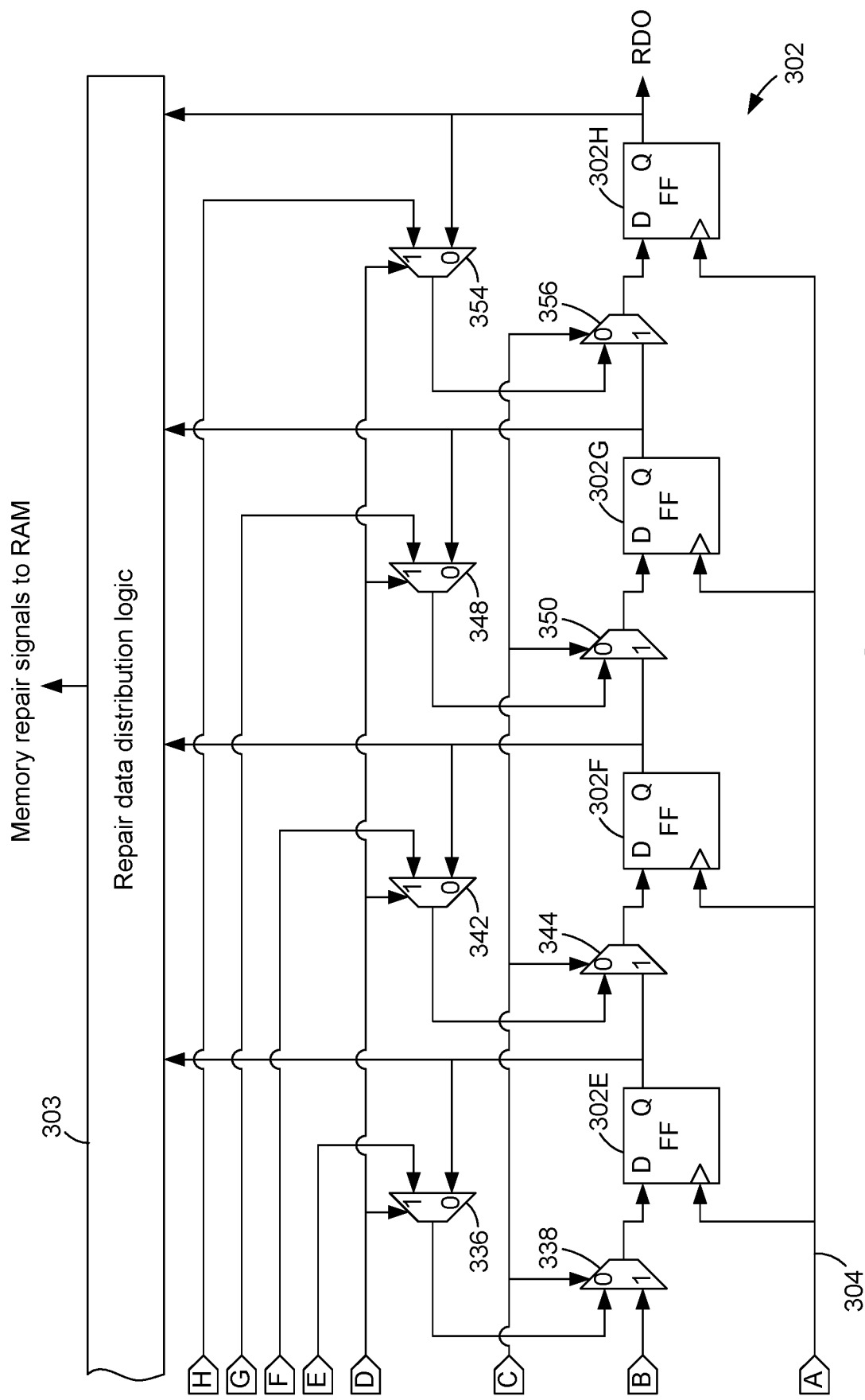
FIG. 3B is a continuation of the block diagram of FIG. 3A.

In FIGS. 3A-3B, repair data register chain and multiplexing logic 300 and repair data distribution logic 303 are shown. The repair data register chain and multiplexing logic 300 may be an example of the above-described repair data register chain and multiplexing logic 104 (FIG. 1) or 226 (FIG. 2).

The repair data register chain and multiplexing logic 300 may include data registers (e.g., D-type flip-flops) 302. The data registers 302 may be serially interconnected (i.e., in a chain): the data output ("Q") of a first register 302A (FIG. 3A) may be coupled (e.g., via any number of intervening multiplexing or other components, as described below) to the data input ("D") of a second register 302B (FIG. 3A). The data output of the second register 302B may be coupled to the data input of a third register 302C (FIG. 3A). The data output of the third register 302C may be coupled to the data input of a fourth register 302D (FIG. 3A). The data output of the fourth register 302D may be coupled to the data input of a fifth register 302E (FIG. 3B). The data output of the fifth register 302E may be coupled to the data input of a sixth register 302F (FIG. 3B). The data output of the sixth register 302F may be coupled to the data input of a seventh register 302G (FIG. 3B). The data output of the seventh register 302G may be coupled to the data input of an eighth register 302H (FIG. 3B). This configuration enables data to be shifted serially through the data registers 302, i.e., from a preceding data register 302 in the chain to the next data register 302 in the chain. Whether data is read into the registers 302, shifted through the registers 302, or held in the registers 302 may be controlled by the multiplexing logic described below. Although in the illustrated embodiment eight data registers 302 are included in the chain, in other embodiments there may be more or fewer than eight such serially interconnected data registers. For example, there may be thousands of such serially interconnected (i.e., in a chain) data registers.

A clock signal may be provided to each data register 302 via a signal path 304. The clock signal provided to the data registers 302 may be selected by a clock MUX 306 (FIG. 3A) from either the TCK signal or a functional clock signal ("func_clk"). The functional clock signal may be the same as a clock signal under which functional logic of the SoC (not shown in FIGS. 3A-3B) operates. When the SoC powers up or is otherwise initialized, this functional clock signal not only begins to operate the SoC in mission mode but may also, based on the selection made by the clock MUX 306, operate the data registers 302. The clock MUX 306 may select between its inputs in response to the mem_sr_en signal provided by the control signal register chain 228 (FIG. 2). The mem_sr_en signal serves as a mode select signal that controls whether the hard-repair mode or the soft-repair mode is selected. When the SoC powers up or is otherwise initialized, the mem_sr_en signal is low, indicating the hard-repair mode.

The repair data register chain and multiplexing logic 300 may include fuse-sense logic 308 (FIG. 3A). The fuse-sense logic 308 may be an example of the above-described fuse-sense logic 108 (FIG. 1). A fuse PROM to which the fuse-sense logic 308 may be coupled is not shown in FIG. 3A for purposes of clarity. Outputs of the fuse-sense logic 308, which provide hard-repair data, may be coupled to the data inputs of at least some of the data registers 302. Hard-repair data provided by the fuse-sense logic 308 thus may be read into the data registers 302, controlled by the multiplexing logic described below.

In the illustrated embodiment, and with reference first to FIG. 3A, the data input of the first register 302A may be coupled to a first output 310A of the fuse-sense logic 308 via a portion of the multiplexing logic comprising a MUX 312 and a MUX 314. The data input of the second register 302B may be coupled to a second output 310B of the fuse-sense logic 308 via paths through a portion of the multiplexing logic comprising a MUX 318 and a MUX 320. The data input of the third register 302C may be coupled to a third output 310C of the fuse-sense logic 308 via paths through a portion of the multiplexing logic comprising a MUX 324 and a MUX 326. The data input of the fourth register 302D may be coupled to fourth output 310D of the fuse-sense logic 308 via paths through a portion of the multiplexing logic comprising a MUX 330 and a MUX 332.

Continuing in FIG. 3B, the data input of the fifth register 302E may be coupled to the data output of the first register 302A (FIG. 3A) via paths through a portion of the multiplexing logic comprising a MUX 336 and a MUX 338. The data input of the sixth register 302F may be coupled to the data output of the second register 302B (FIG. 3A) via paths through a portion of the multiplexing logic comprising a MUX 342 and a MUX 344. The data input of the seventh register 302G may be coupled to the data output of the third register 302C (FIG. 3A) via paths through a portion of the multiplexing logic comprising a MUX 348 and a MUX 350. The data input of the eighth register 302H may be coupled to the data output of the fourth register 302D (FIG. 3A) via paths through a portion of the multiplexing logic comprising a MUX 354 and a MUX 356.

Note that in the illustrated embodiment four outputs 310A-310D of the fuse-sense logic 308 are coupled to data inputs of a first group of four registers 302A-302D, and the outputs of the first group of four registers 302A-302D are coupled to the inputs of a second group of four registers 302E-302H. The registers 302 are coupled in groups of four in this manner because in the illustrated embodiment repair data are read four bits at a time from the fuse-sense logic 308. Accordingly, repair data read from the fuse-sense logic 308 are shifted through the registers 302 in the same four-bit units. Initially, in a first read operation a first set of four bits may be read from the fuse-sense logic 308 into the first group of registers 302A-302D. Then, in a second read operation, a second set of four bits may be read from the fuse-sense logic 308 into the first group of registers 302A-302D while the first set of four bits is being shifted from the first group of registers 302A-302D into the second group of registers 302E-302H. These read operations may be repeated until all hard-repair data has been read into all registers 302. Although in the illustrated embodiment four outputs 310A-310D of the fuse-sense logic 308 are coupled to data inputs of four registers 302A-302D, in other embodiments more outputs of such fuse-sense logic may by coupled to more such data registers, such as, for example, data inputs of registers 302E-302H. In other embodiments repair data may be read in units of any other number of bits, such as 16 at a time, 32 at a time, etc., and there would be a correspondingly larger number of registers.

The MUXes 312, 318, 324, 330, 336, 342, 348 and 354 may be controlled by the output of an AND gate 358. The inputs of the AND gate 358 may be coupled to the read_fuse signal and the complement of the mem_sr_en signal. In the hard-repair mode, the mem_sr_en signal is low (i.e., has a value of "0"), thereby enabling the read_fuse signal to control the MUXes 312, 318, 324, 330, 336, 342, 348 and 354. The MUXes 314, 320, 326, 332, 338, 344, 350 and 356 may be controlled by the output of another AND gate 360. The inputs of the AND gate 360 may be coupled to the mem_sr_en signal and the mem_sr_data_shift signal. When mem_sr_en is low (indicating the hard-repair mode) and the read_fuse signal is high, the MUXes 312-332 couple the outputs 310A-310D of the fuse-sense logic 308 to the inputs of the first group of four registers 302A-302D, and the MUXes 336-356 couple the outputs of the first group of four registers 302A-302D to the inputs of the second group of four registers 302E-302H.

In the hard repair mode, when the read_fuse signal goes low, indicating the hard-repair data has been read, the MUXes 312-356 couple the outputs of the registers 302 to their respective inputs. In this state, on each cycle of the functional clock signal the data at the outputs of the registers 302 is clocked back into the registers 302, thereby holding the data.

When all registers 302 have been loaded with hard-repair data in this manner, a MUX 362 may assert a repair_data_ready signal. The MUX 362 may select the fuse_sense_done signal as the repair_data_ready signal when mem_sr_en is low, indicating the hard-repair mode. In the hard-repair mode, in response to this assertion of the repair_data_ready signal, the repair data distribution logic 303 may send the data from the outputs of the registers 302 to the repair information input of the RAM.

The soft-repair mode may be selected by storing a value of "1" (i.e., logic-high) in the corresponding JDR 227 of the control signal register chain 228 (FIG. 2). As noted above, when mem_sr_en is high the MUX 306 selects the TCK signal to clock the registers 302. The mem_sr_data_shift signal may be asserted in preparation for shifting soft-repair data into the registers 302.

Also, when mem_sr_en is high and mem_sr_data_shift is high, the output of the AND gate 360 causes the MUXes 314, 320, 326, 332, 338, 344, 350 and 356 to couple the TDI signal to the inputs of the registers 302. The TDI signal may provide soft-repair data, which is clocked into the registers 302 by the TCK signal. When all soft-repair data has been shifted into the registers 302, the soft-repair data may be held in the registers 302 by de-asserting the mem_sr_data_shift signal. In the soft-repair mode, after all soft-repair data has been shifted into the registers 302, the output of the AND gate 358 is low because the mem_sr_en signal is high (and thus the complement of mem_sr_en is low). Also, in the soft-repair mode after all soft-repair data has been shifted into the registers 302, the output of the AND gate 360 is low because mem_sr_data_shift is low. When the outputs of both AND gates 358 and 360 are low, the MUXes 312-356 couple the outputs of the registers 302 to the respective inputs of the register 302. In this state, on each cycle of the TCK signal the data at the outputs of the registers 302 is clocked back into the registers 302, thereby holding the data.

When all registers 302 have been loaded with soft-repair data in this manner, the MUX 362 may assert the repair_data_ready signal. The MUX 362 selects the mem_sr_done signal as the repair_data_ready signal when mem_sr_en is high, indicating the soft-repair mode. In response to this assertion of the repair_data_ready signal in the soft-repair mode, the repair data distribution logic 303 may send the data from the outputs of the registers 302 to the repair information input of the RAM.

The data outputs of the registers 302 thus collectively provide the hard-repair data to the repair data distribution logic 303 when the hard-repair mode is selected and the soft-repair data to the repair data distribution logic 303 when the soft-repair mode is selected. The multiplexing logic portion, comprising MUXes 306 and 312-358, may operate based on whether the hard-repair mode or the soft-repair mode is selected.

Figure 4:
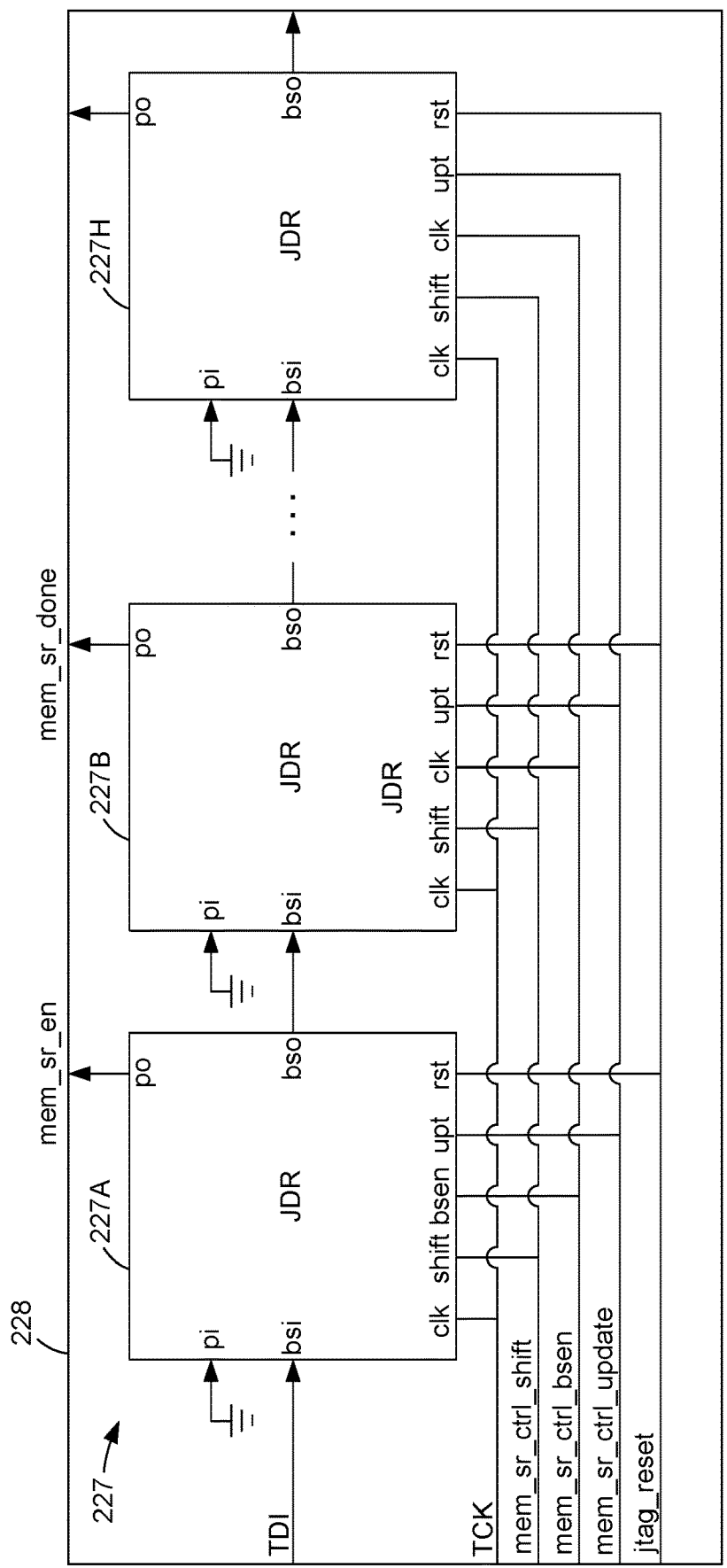
FIG. 4 is a block diagram of control signal chain register logic, in accordance with exemplary embodiments.

As shown in FIG. 4, the exemplary control signal register chain 228 may include eight JDRs 227: a first JDR 227A, second JDR 227B, etc., through an eighth JDR 227H. For purposes of clarity only the three JDRs 227A, 227B and 227H are shown, and the inclusion of the remaining four JDRs 227 is indicated by the ellipsis (" . . . ") symbol. In the illustrated embodiment, only the two JDRs 227A and 227B are used, and the remaining six JDRs 227 may be left unused. The first JDR 227A may be configured to store a first control bit C0, representing the mem_sr_en signal. The second JDR 227B may be configured to store a second control bit C1, representing the mem_sr_done signal. The eighth JDR 227H may be configured to store an eighth control bit C7, but it is unused in this example.

As understood by one of ordinary skill in the art, each JDR 227 may have the following inputs and outputs: a clock signal input ("clk"), a shift signal input ("shift"), a read-or-hold select signal input ("bsen"), an update signal input ("upt"), a reset signal input ("rst"), a primary data input ("pi"), a primary data output ("po"), a shift data input ("bsi"), and a shift data output ("bso"). In the control signal register chain 228, the shift data input of the first JDR 227A may be configured to receive the TDI signal, and the shift data input of each other JDR 227 in the chain may be coupled to the shift data output of the preceding JDR 227 in the chain. The primary data output of the first JDR 227A (the C0 control bit) may provide the mem_sr_en signal. The primary data output of the second JDR 227B (the C1 control bit) may provide the mem_sr_done signal. The clock signal input of each JDR 227 may be configured to receive the TCK signal. The shift signal input of each JDR 227 may be configured to receive the mem_sr_ctrl_shift signal. The read/hold select signal input of each JDR 227 may be configured to receive the mem_sr_ctrl_bsen signal. The update signal input of each JDR 227 may be configured to receive the mem_sr_ctrl_update signal. The reset signal input of each JDR 227 may be configured to receive the jtag_reset signal.

Figure 5:
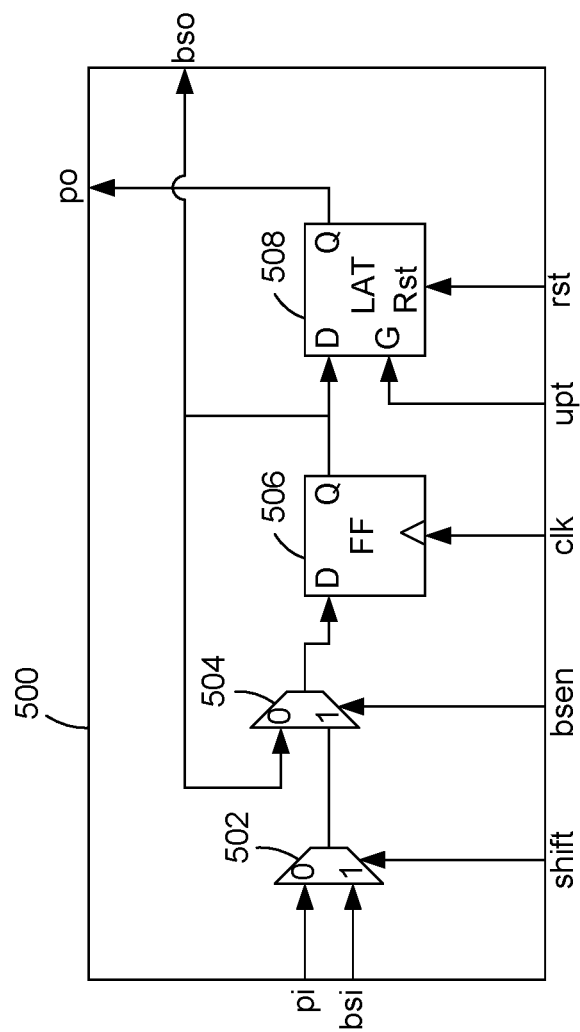
FIG. 5 is a block diagram of a JTAG data register, in accordance with exemplary embodiments.

In FIG. 5, an exemplary JDR 500 is shown. The JDR 500 may be an example of each of the JDRs 227 (FIG. 4). The JDR 500 may include a first MUX 502, a second MUX 504, a flip-flop 506, and a latch 508. The two inputs of the MUX 502 may be the primary data input and the shift data input of the JDR 500. The control input of the MUX 502 may be the shift signal input of the JDR 500. One input of the MUX 504 may be coupled to the output of the MUX 502. The other input of the MUX 504 may be coupled to the Q output of the flip-flop 506. The control input of the MUX 506 may be the read/hold select signal input of the JDR 500. The D input of the flip-flop 506 may be coupled to the output of the MUX 504. The clock input of the flip-flop 506 may be the clock signal input of the JDR 500. The Q output of the flip-flop 506 may also be coupled to the D input of the latch 508 and may further be the shift data output of the JDR 500. The Q output of the latch 508 may be the primary data output of the JDR 500. The latch control input G of the latch 508 may be the update signal input of the JDR 500. The reset input of the latch 508 may be the reset signal input of the JDR 500. It may be noted that systems in accordance with the solutions described herein include only one set of data registers, such as the registers 302 (FIG. 3); such systems do not include a first set of registers for soft repair data and a second set of registers for hard repair data. In contrast, some conventional memory repair systems (not shown) may include both a chain of several thousand serially interconnected JTAG data registers for soft repair data and an array of several thousand fuse-sense registers for hard repair. Instead, the solutions described herein efficiently use the same registers, such as the registers 302, for both hard repair and soft repair. Fewer registers and associated data paths (i.e., conductors) on an SoC or other chip may reduce chip area congestion and/or leave the chip area that would have been occupied by such registers and associated data paths (i.e., conductors) available for other components, data paths, etc. Fewer registers on an SoC or other chip may also help reduce power consumption.

Figure 6:
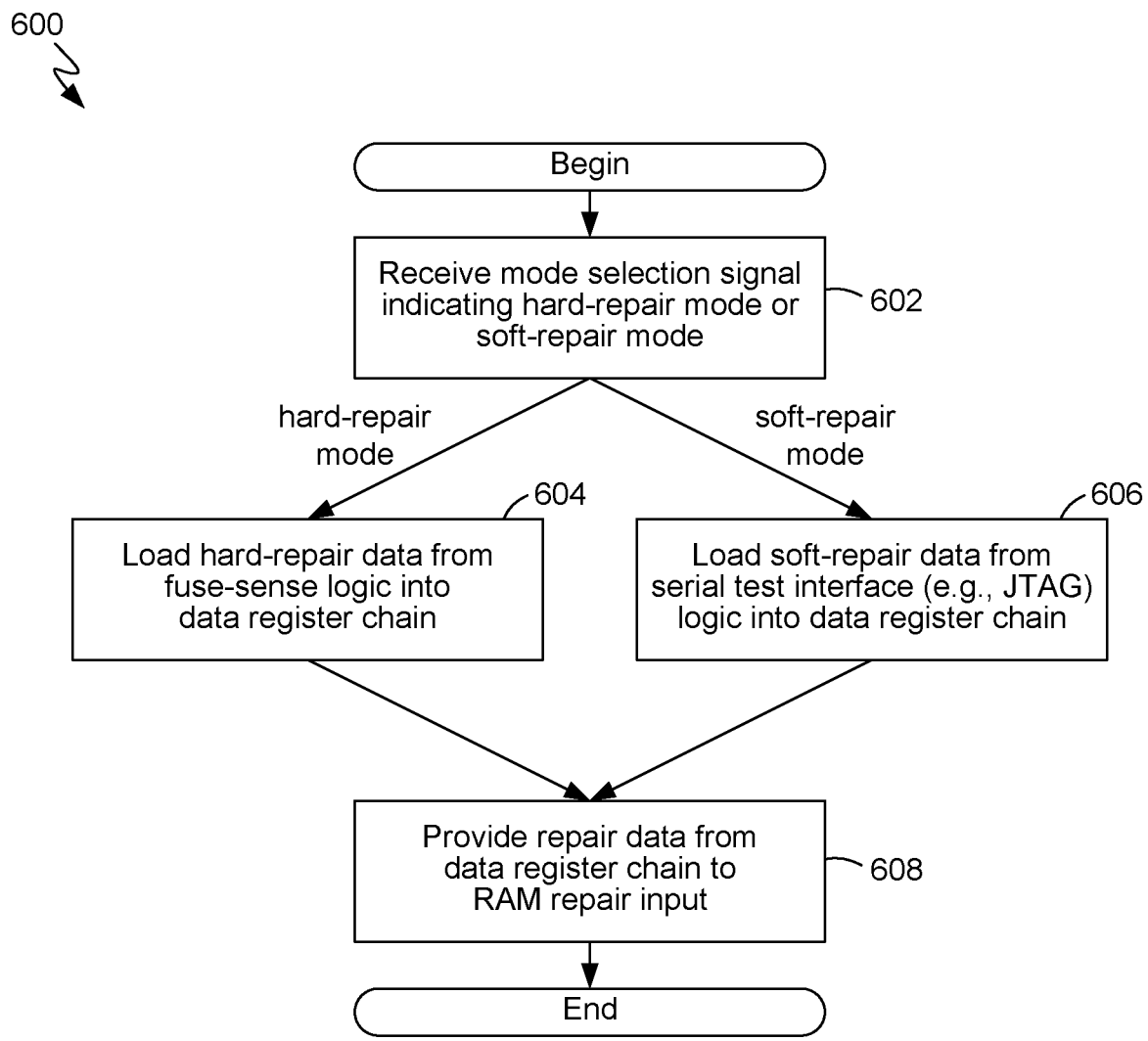
FIG. 6 is a flow diagram illustrating a memory repair method, in accordance with exemplary embodiments.

In FIG. 6 a method 600 for repairing a RAM is illustrated in flow diagram form. As indicated by block 602, the method 600 may include receiving a mode selection signal indicating a soft-repair mode or a hard-repair mode. For example, setting a control bit of a control signal register chain may select the hard-repair mode. In addition, or alternatively, the hard-repair mode may be selected in response to a power-on-reset of the system.

As indicated by block 604, the method 600 may include reading hard-repair data from fuse-sense logic into the repair data register chain via the multiplexing logic when the mode selection signal indicates the hard-repair mode. For example, further responsive to a power-on-reset, the hard-repair data may be read from the fuse-sense logic into the repair data register chain using the functional clock signal.

As indicated by block 606, the method 600 may include reading soft-repair data from JTAG logic or other serial test interface logic into a repair data register chain via the multiplexing logic when the mode selection signal indicates the soft-repair mode. For example, setting a control bit of the control signal register chain may select the soft-repair mode. Repair data bits may then be loaded into the repair data register chain using the JTAG logic.

As indicated by block 608, the method 600 may include providing repair data from outputs of the data registers to a repair information input of the RAM. The repair data may be hard-repair data that was read into the repair data register chain per block 604 or soft-repair data that was read into the repair data register chain per block 606.

Figure 7:
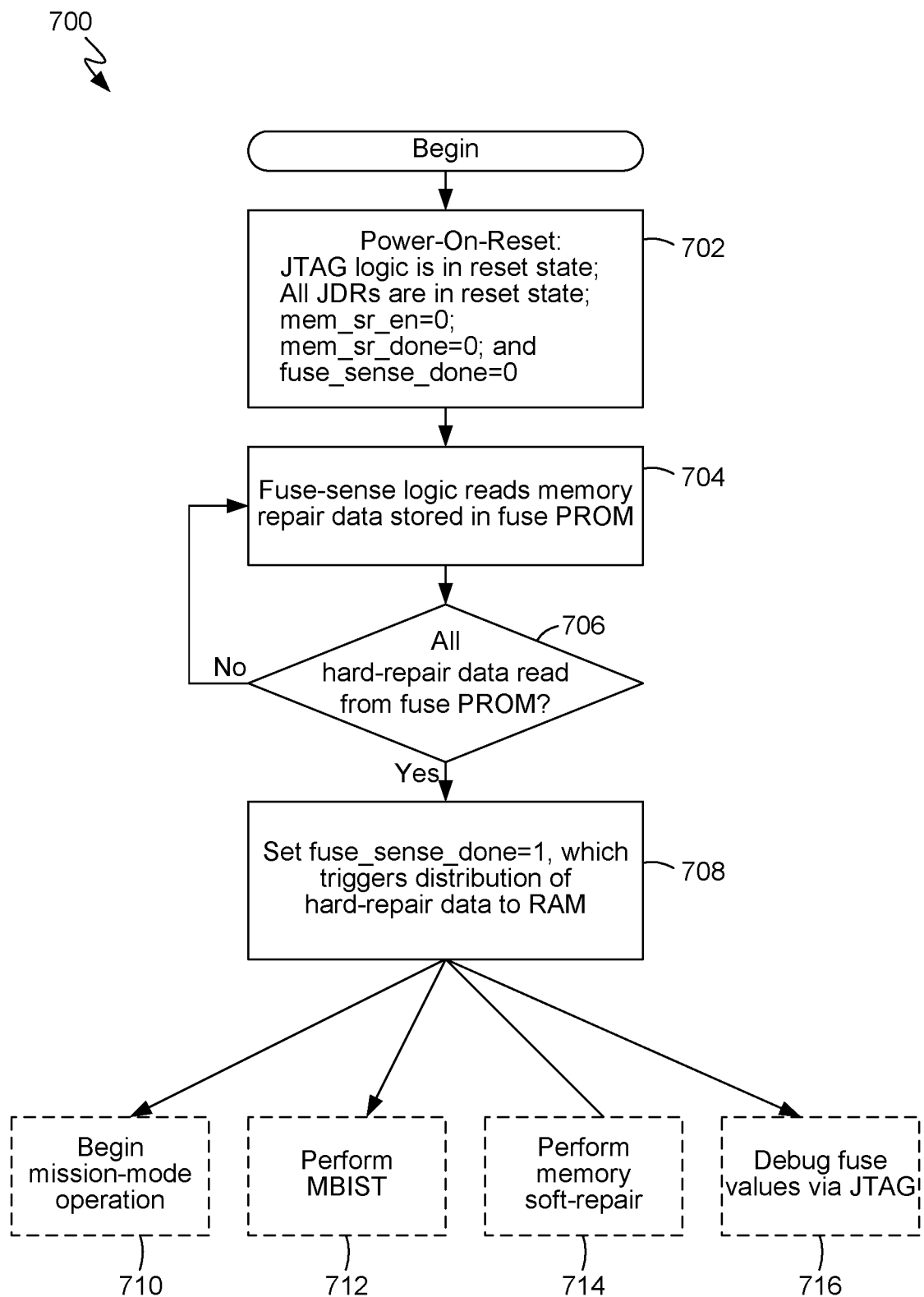
FIG. 7 is a flow diagram illustrating a hard-repair method, in accordance with exemplary embodiments.

In FIG. 7 a method 700 for performing a hard-repair on a RAM using the system of FIGS. 2 and 3A-3B is illustrated in flow diagram form. As indicated by block 702, a power-on-reset may be performed. As a result of the power-on-reset, various logic elements may be initialized as follows. All JTAG logic 202 (FIG. 2) may be in a reset state. All JDRs 227 (FIGS. 2 and 4) may be in a reset state. Accordingly, the mode select signal, mem_sr_en and mem_sr_done may have a value of "0". As the fuse-sense logic and repair data distribution logic 226 (FIG. 2) are in a reset state, the fuse_sense_done signal may have a value of "0", and all data to memory repair inputs of the RAM may have values of "0".

As indicated by block 704, in response to the above-referenced signals having been initialized, the fuse-sense logic 308 (FIG. 3A) may read the hard-repair data from the fuse PROM. As indicated by block 706, the operation indicated by block 704 may be repeated until all of the hard-repair data has been read from the fuse PROM. When all hard-repair data has been read from the fuse PROM, the fuse_sense_done signal may have a value of "1". In response to the fuse_sense_done signal having a value of "1", the repair data distribution logic 303 may distribute the hard-repair data to the RAM repair information input.

Although block 708 may conclude the hard-repair method 700, additional operations may follow the repair. For example, the memory system, including the (repaired) RAM may begin mission-mode operation, as indicated by block 710. Alternatively, a memory built-in self-test or "MBIST" may be performed on the (repaired) RAM, as indicated by block 712. Alternatively, a soft-repair method may be performed on the RAM following the hard repair, as indicated by block 714. (A soft-repair method is described below with regard to FIG. 8.) As indicated by block 716, still another alternative following the hard repair of the RAM may be to debug the PROM fuses using the JTAG logic 202 (FIG. 2). For example, following a hard repair it may be determined that the hard-repair data was incorrect. Note in FIG. 2 that the repair data register chain and multiplexing logic 226 may have a serial repair data output ("RDO") coupled to an input of the MUX 222. Through this path, repair data values (e.g., fuse values) may be shifted out of the registers 302 (FIGS. 3A-3B) and read from the TDO signal output of the JTAG logic 202. The output of the last register 302H in the chain may provide the RDO path that is coupled to the input of the MUX 222. A method similar to the portion of the method 800 described below (FIG. 8) indicated by blocks 802-808, may be employed.

Figure 8:
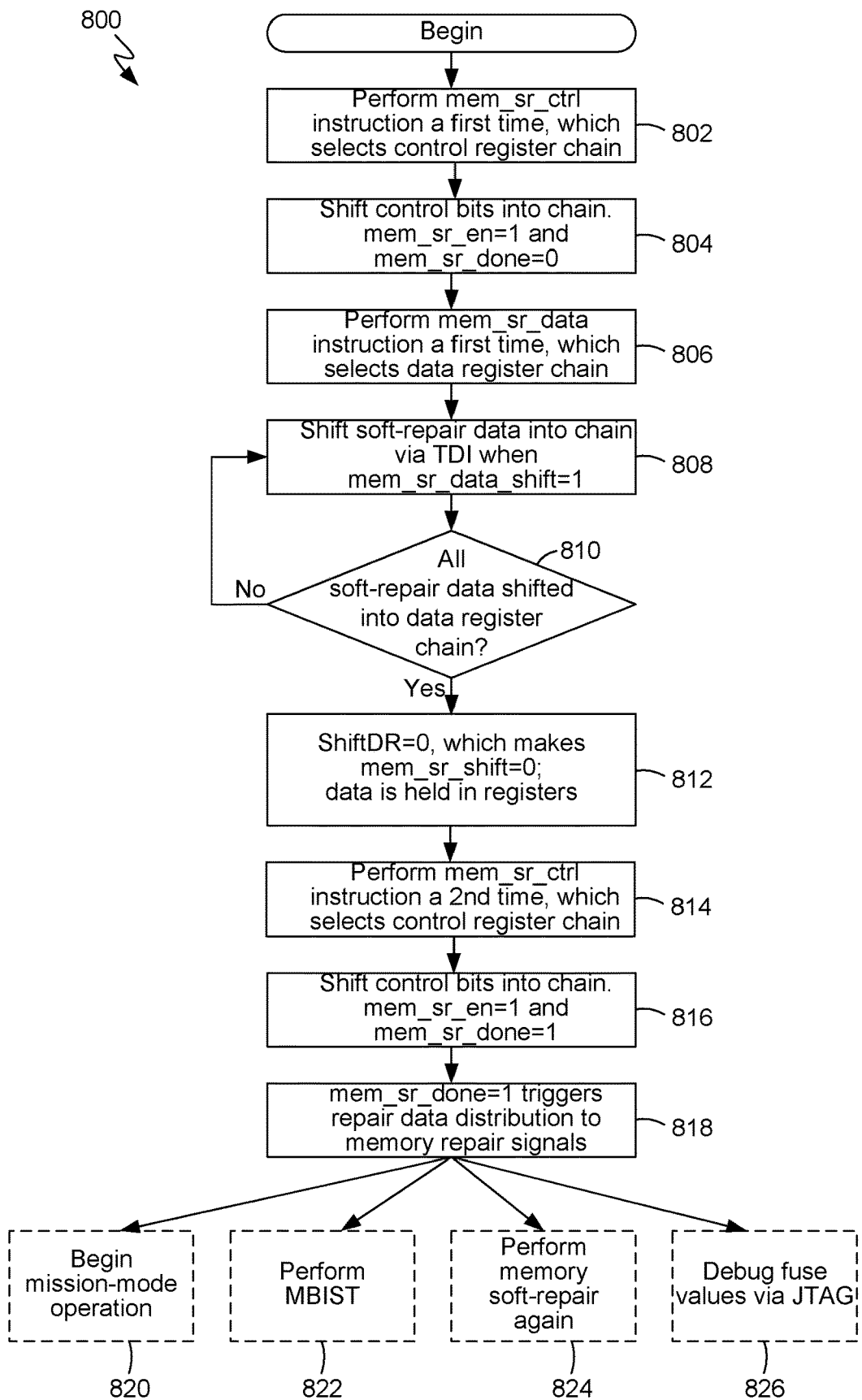
FIG. 8 is a flow diagram illustrating a soft-repair method, in accordance with exemplary embodiments.

In FIG. 8 a method 800 for performing a soft repair on a RAM using the system of FIGS. 2 and 3A-3B is illustrated in flow diagram form. As indicated by block 802, the JTAG logic 202 (FIG. 2) may be used to issue a mem_sr_ctrl instruction. In response to the mem_sr_ctrl instruction, the instruction gating logic 232 (FIG. 2) may select the control signal register chain 228 (FIG. 2), i.e., may enable the mem_sr_ctrl_shift, mem_sr_ctrl_bsen and mem_sr_ctrl_update signals to control the control signal register chain 228.

As indicated by block 804, with the control signal register chain 228 (FIG. 2) in this selected or enabled state, control bits may be shifted into the JDRs 227 of the control signal register chain 228 (FIG. 2). Using the JTAG logic 202, the TAP controller 212 may assert the SHIFT_DR signal on the signal path 235 to prepare for the control bits to be shifted into the JDRs 227. In response to assertion of the SHIFT_DR signal, the instruction gating logic 232 may set the mem_sr_ctrl_shift signal to "1" and set the mem_sr_ctrl_bsen_signal to "1". The control bits may be provided using the TDI and TCK signals. To enable the soft-repair mode, a value of "1" may be shifted into the control bit C0 to set the mem_sr_en signal to "1". A value of 0" may be shifted into the control bit C1 to set the mem_sr_done signal to "0". When all control bits have been shifted into the JDRs 227, the TAP controller 212 may de-assert the SHIFT_DR signal. In response to de-assertion of the SHIFT_DR signal, the instruction gating logic 232 may set the mem_sr_ctrl_shift signal to "0" and set the mem_sr_ctrl_bsen_signal to "0". The TAP controller 212 may then assert the UPDATE_DR signal. In response to the UPDATE_DR signal, the instruction gating logic 232 may produce the mem_sr_ctrl_update signal. In response to the mem_sr_ctrl_update signal, the JDRs 227 latch the values at their Q inputs.

As indicated by block 806, the JTAG logic 202 (FIG. 2) may then be used to issue a mem_sr_data instruction. In response to the mem_sr_data instruction, the instruction gating logic 232 (FIG. 2) may select the repair data register chain and multiplexing logic 226 (FIG. 2), i.e., may enable the mem_sr_data_shift to control the repair data register chain and multiplexing logic 226.

As indicated by block 808, with the repair data register chain and multiplexing logic 226 (FIG. 2) in this selected or enabled state, soft-repair data bits may be shifted into the registers 302 (FIGS. 3A-3B). Using the JTAG logic 202, the TAP controller 212 (FIG. 2) may assert the SHIFT_DR signal on the signal path 235 to prepare for the soft-repair data bits to be shifted into the registers 302. In response to assertion of the SHIFT_DR signal, the instruction gating logic 232 may set the mem_sr_data_shift signal to "1".

The above-described blocks 802-808 relate to shifting repair data into the registers 302 (FIGS. 3A-3B) for soft-repair purposes. As noted above, a similar method may be used to shift repair data values (e.g., hard-repair fuse values) out of the registers 302 into the JTAG logic 202 (FIG. 2), thus enabling repair data values to be read via the TDO signal for purposes of, for example, debugging the fuse values.

The soft-repair data bits may be provided using the TDI and TCK signals. As indicated by block 810, the operations of block 808 may continue until all soft-repair data bits have been shifted into the registers 302. When all control bits have been shifted into the register 302, the TAP controller 212 may de-assert the SHIFT_DR signal. As indicated by block 812, in response to de-assertion of the SHIFT_DR signal, the instruction gating logic 232 may set the mem_sr_data_shift signal to "0". In response to the mem_sr_data_shift signal having a value of "0", the MUXes 314, 320, 326, 332, 338, 344, 350 and 356 retain or hold the contents of the registers 302, as described above.

As indicated by block 814, following the above-described loading of soft-repair data into the registers 302 (FIGS. 3A-3B), the JTAG logic 202 (FIG. 2) may be used to issue another mem_sr_ctrl instruction. In response to this mem_sr_ctrl instruction, the instruction gating logic 232 (FIG. 2) may again select the control signal register chain 228 (FIG. 2).

As indicated by block 816, the control bits may be set again. The TAP controller 212 may assert the SHIFT_DR signal on the signal path 235 to prepare for the control bits to be shifted into the JDRs 227. In response to assertion of the SHIFT_DR signal, the instruction gating logic 232 may set the mem_sr_ctrl_shift signal to "1" and set the mem_sr_ctrl_bsen_signal to "1". The control bits may be provided using the TDI and TCK signals. A value of "1" may be shifted into the control bit C0 to set the mem_sr_en signal to "1". A value of "1" may be shifted into the control bit C1 to set the mem_sr_done signal to "1", indicating that the soft-repair data has been loaded into the registers 302 (FIGS. 3A-3B). When all control bits have been shifted into the JDRs 227, the TAP controller 212 may de-assert the SHIFT_DR signal. In response to de-assertion of the SHIFT_DR signal, the instruction gating logic 232 may set the mem_sr_ctrl_shift signal to "0" and set the mem_sr_ctrl_bsen_signal to "0". The TAP controller 212 may then assert the UPDATE_DR signal. In response to the UPDATE_DR signal, the instruction gating logic 232 may produce the mem_sr_ctrl_update signal. In response to the mem_sr_ctrl_update signal, the JDRs 227 latch the values at their Q inputs.

As indicated by block 818, in response to the mem_sr_done signal having a value of "1", the repair data distribution logic 303 may distribute the soft-repair data from the registers 302 to the repair information input of the RAM. Although block 818 may conclude the hard-repair method 800, additional operations may follow the repair. Blocks 820, 822, 824 and 826 indicate four examples of various alternative additional operations. Blocks 820-826 indicate the same types of additional operations as the above-described blocks 710-716 (FIG. 7).

Figure 9:
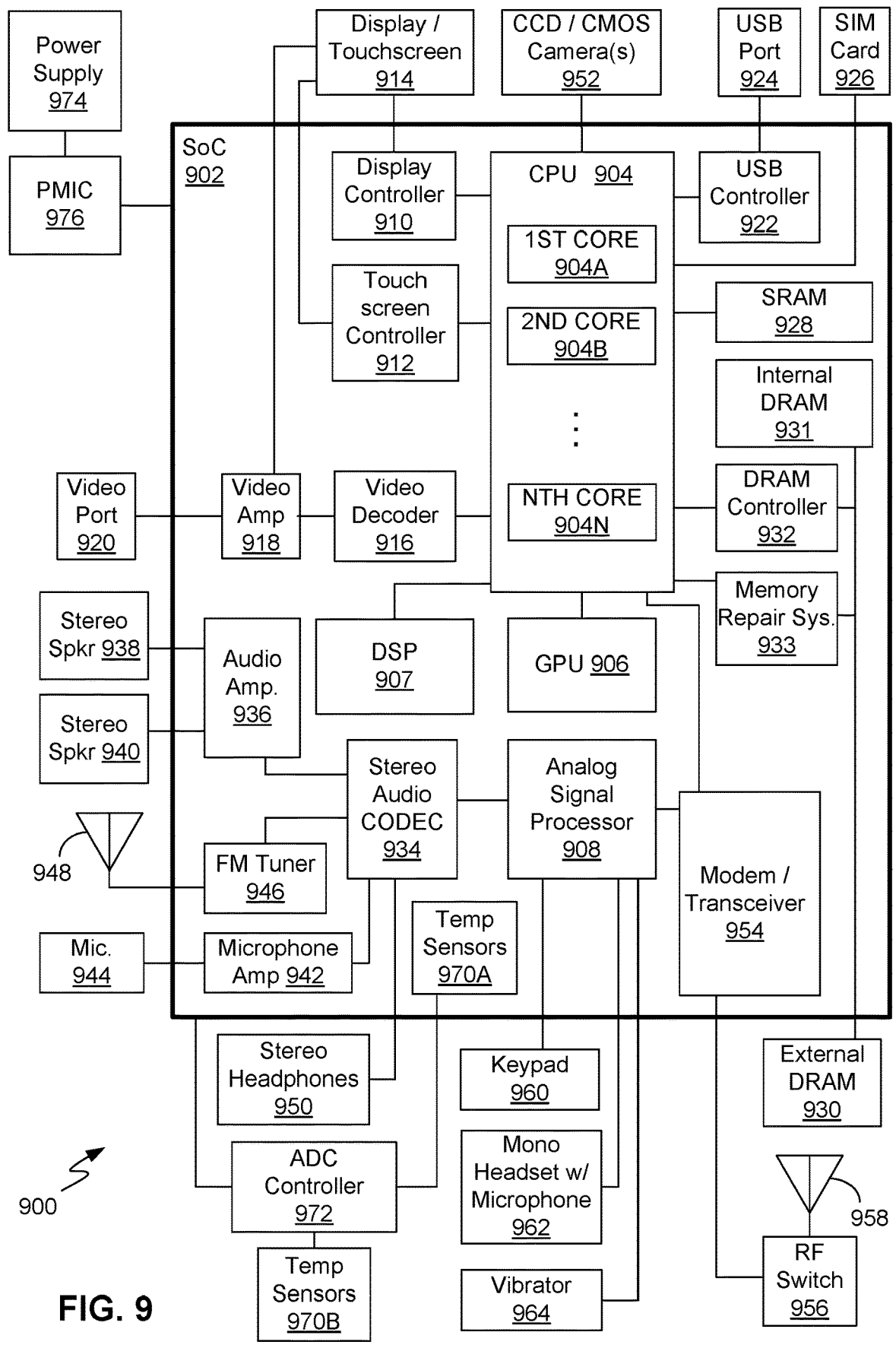
FIG. 9 is block diagram of a portable computing device, in accordance with exemplary embodiments.

FIG. 9 illustrates an example of a portable computing device ("PCD") 900, in which exemplary embodiments of systems, methods, computer-readable media, and other examples of memory repair may be provided. The PCD 900 may be, for example, a laptop or palmtop computer, cellular telephone or smartphone, personal digital assistant, navigation device, smartbook, portable game console, satellite telephone, etc. Nevertheless, systems, methods, computer-readable media, and other examples of memory repair may be provided in any other type of computing device or component thereof. For purposes of clarity in FIG. 9, some data buses or interconnects, signal paths, etc., are not shown, and others may be shown in a conceptual manner. Nevertheless, it should be understood that the components of the PCD 900 may be coupled through such interconnects or signal paths.

The PCD 900 may include an SoC 902. The SoC 902 may include a central processing unit ("CPU") 904, a graphics processing unit ("GPU") 906, a digital signal processor ("DSP") 907, an analog signal processor 908, a modem/modem subsystem 954, or other processors. The CPU 904 may include one or more CPU cores, such as a first CPU core 904A, a second CPU core 904B, etc., through an Nth CPU core 904N.

A display controller 910 and a touch-screen controller 912 may be coupled to the CPU 904. A touchscreen display 914 external to the SoC 902 may be coupled to the display controller 910 and the touch-screen controller 912. The PCD 900 may further include a video decoder 916 coupled to the CPU 904. A video amplifier 918 may be coupled to the video decoder 916 and the touchscreen display 914. A video port 920 may be coupled to the video amplifier 918. A universal serial bus ("USB") controller 922 may also be coupled to CPU 904, and a USB port 924 may be coupled to the USB controller 922. A subscriber identity module ("SIM") card 926 may also be coupled to the CPU 904.

One or more memories may be coupled to the CPU 904. The one or more memories may include both volatile and non-volatile memories. Examples of volatile memories include static RAM ("SRAM") 928 and dynamic RAM ("DRAM") 930 and 931. Such memories may be external to the SoC 902, such as the DRAM 930, or internal to the SoC 902, such as the DRAM 931. A DRAM controller 932 coupled to the CPU 904 may control the writing of data to, and reading of data from, the DRAMs 930 and 931. Either or both of the DRAMs 930 and 931 may be an example of the RAM 102 (FIG. 1).

The SoC 902 may include a memory repair system 933, which may be coupled to the CPU 904 and one or both of the DRAMs 930 and 931. The memory repair system 933 may comprise portions of the above-described memory repair system 100 (FIG. 1) or 200 (FIG. 2). Although in the embodiments illustrated in FIGS. 1, 2, etc., for purposes of clarity the JTAG logic or other serial test interface logic is included in the memory repair systems 100, 200, etc., one of ordinary skill in the art understands that such serial test interface logic may be used for other purposes, such as testing various functionality of the SoC 702. Accordingly, such serial test interface logic may be a distinct subsystem from the memory repair system 933 and may be coupled to other SoC subsystems, other JTAG data registers, SoC boundary scan flip-flops (not shown), etc. More generally, as understood by one of ordinary skill in the art, such serial test interface logic provides a way to transfer test data onto and off of the SoC 902 (e.g., to and from test equipment (not shown) external to the SoC 902). The serial test interface logic may be used in testing the SoC 902 prior to the providing the SoC 902 in the PCD 900.

A stereo audio CODEC 934 may be coupled to the analog signal processor 908. Further, an audio amplifier 936 may be coupled to the stereo audio CODEC 934. First and second stereo speakers 938 and 940, respectively, may be coupled to the audio amplifier 936. In addition, a microphone amplifier 942 may be coupled to the stereo audio CODEC 934, and a microphone 944 may be coupled to the microphone amplifier 942. A frequency modulation ("FM") radio tuner 946 may be coupled to the stereo audio CODEC 934. An FM antenna 948 may be coupled to the FM radio tuner 946. Further, stereo headphones 950 may be coupled to the stereo audio CODEC 934. Other devices that may be coupled to the CPU 904 include one or more digital (e.g., CCD or CMOS) cameras 952.

The modem or RF transceiver 954 may be coupled to the analog signal processor 908 and the CPU 904. An RF switch 956 may be coupled to the RF transceiver 954 and an RF antenna 958. In addition, a keypad 960, a mono headset with a microphone 962, and a vibrator device 964 may be coupled to the analog signal processor 908.

The SoC 902 may have one or more internal or on-chip thermal sensors 970A and may be coupled to one or more external or off-chip thermal sensors 970B. An analog-to-digital converter controller 972 may convert voltage drops produced by the thermal sensors 970A and 970B to digital signals. A power supply 974 and a power management integrated circuit ("PMIC") 976 may supply power to the SoC 902 and other components.

Implementation examples are described in the following numbered clauses.

1. A system for repairing a random access memory, comprising:
   serial test interface logic;
   fuse-sense logic;
   a repair data register chain comprising a plurality of serially interconnected data registers configured to shift data serially through the repair data register chain, each data register of the repair data register chain having a data output configured to be coupled to a repair information input of the random access memory; and
   multiplexing logic configured to provide a soft-repair mode and a hard-repair mode, the multiplexing logic configured to selectably receive into the data registers soft-repair data provided by the serial test interface logic when the soft-repair mode is selected or hard-repair data provided by the fuse-sense logic when the hard-repair mode is selected.
2. The system of clause 1, wherein the serial test interface logic comprises Joint Test Action Group (JTAG) logic.
3. The system of clause 1 or 2, wherein the multiplexing logic comprises a first plurality of multiplexers corresponding to the plurality of data registers, each multiplexer of the first plurality of multiplexers having an output coupled to a data input of the corresponding data register, each multiplexer of the first plurality of multiplexers having a first input configured to receive a portion of the hard-repair data provided by the fuse-sense logic and a second input configured to receive a portion of the soft-repair data.
4. The system of clause 3, wherein the second input of a first multiplexer of the first plurality of multiplexers is coupled to a serial data output of the serial test interface logic, and the second input of each other multiplexer of the first plurality of multiplexers is coupled to the data output of one of the data registers.
5. The system of clause 4, further comprising a second plurality of multiplexers corresponding to the plurality of data registers, a first input of each multiplexer of the second plurality of multiplexers coupled to the fuse-sense logic, a second input of each multiplexer of the second plurality of multiplexers coupled to the data output of the corresponding data register, and an output of each multiplexer of the second plurality of multiplexers coupled to the first input of a multiplexer of the first plurality of multiplexers.
6. The system of any of clauses 1-5, further comprising a clock multiplexer configured to selectably couple to a clock input of each data register a serial test interface clock signal when the soft-repair mode is selected or a functional clock signal when the hard-repair mode is selected.
7. The system of any of clauses 1-6, further comprising a control signal register chain comprising a plurality of serially interconnected control signal registers configured to shift data serially through the control signal register chain, an input of the control signal register chain coupled to a serial data output of the serial test interface logic, an output of each control signal register coupled to control inputs of the multiplexing logic.
8. The system of any of clauses 1-7, wherein the serial test interface logic, the fuse-sense logic, the repair data register chain, and the multiplexing logic are included in a system-on-a-chip (SoC).
9. A system for repairing a random access memory, comprising:
   means for receiving a mode selection signal indicating a soft-repair mode or a hard-repair mode;
   means for reading soft-repair data from serial test interface logic into a repair data register chain via multiplexing logic in response to the mode selection signal indicating the soft-repair mode, the repair data register chain comprising a plurality of serially interconnected data registers;
   means for reading hard-repair data from fuse-sense logic into the repair data register chain via the multiplexing logic in response to the mode selection signal indicating the hard-repair mode; and
   means for providing repair information from outputs of the data registers to a repair information input of the random access memory.
10. The system of clause 9, wherein the serial test interface logic comprises Joint Test Action Group (JTAG) logic.
11. The system of clause 9 or 10, wherein:
    the means for reading hard-repair data comprises means for providing a portion of the hard-repair data to a first input of each multiplexer of a first plurality of multiplexers corresponding to the plurality of data registers; and
    the means for reading soft-repair data comprises means for providing a portion of the soft-repair data to a second input of each multiplexer of the first plurality of multiplexers.
12. The system of clause 11, wherein the means for providing the portion of the soft-repair data comprises:
    means for coupling a serial data output of the serial test interface logic to the second input of a first multiplexer of the first plurality of multiplexers; and
    means for coupling outputs of the data registers to the second input of each other multiplexer of the first plurality of multiplexers.
13. The system of clause 12, further comprising:
    means for coupling a first input of each multiplexer of a second plurality of multiplexers to the fuse-sense logic, the second plurality of multiplexers corresponding to the plurality of data registers; and
    means for coupling a second input of each multiplexer of the second plurality of multiplexers to the output of the corresponding data register.
14. The system of any of clauses 9-13, further comprising:
    means for coupling a serial test interface clock signal to a clock input of each data register when the soft-repair mode is selected; and
    means for coupling a functional clock signal to the clock input of each data register when the hard-repair mode is selected.
15. The system of any of clauses 9-14, further comprising:
    means for transferring data serially from the serial test interface logic into a control signal register chain comprising a plurality of serially interconnected control signal registers; and
    means for coupling outputs of the control signal registers to control inputs of the multiplexing logic.
16. A method for repairing a random access memory, comprising:
    receiving a mode selection signal indicating a soft-repair mode or a hard-repair mode;
    reading soft-repair data from serial test interface logic into a repair data register chain via multiplexing logic in response to the mode selection signal indicating the soft-repair mode, the repair data register chain comprising a plurality of serially interconnected data registers;

reading hard-repair data from fuse-sense logic into the repair data register chain via the multiplexing logic in response to the mode selection signal indicating the hard-repair mode; and providing repair information from outputs of the data registers to a repair information input of the random access memory.

17. The method of clause 16, wherein the serial test interface logic comprises Joint Test Action Group (JTAG) logic.

18. The method of clause 16 or 17, wherein:

reading hard-repair data comprises providing a portion of the hard-repair data to a first input of each multiplexer of a first plurality of multiplexers corresponding to the plurality of data registers; and reading soft-repair data comprises providing a portion of the soft-repair data to a second input of each multiplexer of the first plurality of multiplexers.

19. The method of clause 18, wherein providing the portion of the soft-repair data comprises:

coupling a serial data output of the serial test interface logic to the second input of a first multiplexer of the first plurality of multiplexers; and coupling outputs of the data registers to the second input of each other multiplexer of the first plurality of multiplexers.

20. The method of clause 19, further comprising:

coupling a first input of each multiplexer of a second plurality of multiplexers to the fuse-sense logic, the second plurality of multiplexers corresponding to the plurality of data registers; and coupling a second input of each multiplexer of the second plurality of multiplexers to the output of the corresponding data register.

21. The method of any of clauses 16-20, further comprising:

coupling a serial test interface clock signal to a clock input of each data register when the soft-repair mode is selected; and coupling a functional clock signal to the clock input of each data register when the hard-repair mode is selected.

22. The method of any of clauses 16-21, further comprising:

transferring data serially from the serial test interface logic into a control signal register chain comprising a plurality of serially interconnected control signal registers; and coupling outputs of the control signal registers to control inputs of the multiplexing logic.

23. The method of any of clauses 16-22, wherein the method is performed in a system-on-a-chip (SoC).

24. A system-on-a-chip (SoC) having a system for repairing a random access memory, comprising:

fuse-sense logic on the SoC;

serial test interface logic on the SoC, the serial test interface logic comprising Joint Test Action Group (JTAG) logic;

a repair data register chain on the SoC, the repair data register chain comprising a plurality of serially interconnected data registers configured to shift data serially through the repair data register chain, each data register of the repair data register chain having a data output configured to be coupled to a repair information input of the random access memory; and multiplexing logic on the SoC, the multiplexing logic configured to provide a soft-repair mode and a hard-repair mode, the multiplexing logic configured to selectably receive into the data registers soft-repair data provided by the serial test interface logic when the soft-repair mode is selected or hard-repair data provided by the fuse-sense logic when the hard-repair mode is selected.

25. The system of clause 24, wherein the multiplexing logic comprises a first plurality of multiplexers corresponding to the plurality of data registers, each multiplexer of the first plurality of multiplexers having an output coupled to a data input of the corresponding data register, each multiplexer of the first plurality of multiplexers having a first input configured to receive a portion of the hard-repair data provided by the fuse-sense logic and a second input configured to receive a portion of the soft-repair data.

26. The system of clause 24 or 25, wherein the second input of a first multiplexer of the first plurality of multiplexers is coupled to a serial data output of the serial test interface logic, and the second input of each other multiplexer of the first plurality of multiplexers is coupled to the data output of one of the data registers.

27. The system of clause 26, further comprising a second plurality of multiplexers corresponding to the plurality of data registers, a first input of each multiplexer of the second plurality of multiplexers coupled to the fuse-sense logic, a second input of each multiplexer of the second plurality of multiplexers coupled to the data output of the corresponding data register, and an output of each multiplexer of the second plurality of multiplexers coupled to the first input of a multiplexer of the first plurality of multiplexers.

28. The system of any of clauses 24-27, further comprising a clock multiplexer configured to selectably couple to a clock input of each data register a serial test interface clock signal when the soft-repair mode is selected or a functional clock signal when the hard-repair mode is selected.

29. The system of any of clauses 24-28, further comprising a control signal register chain comprising a plurality of serially interconnected control signal registers configured to shift data serially through the control signal register chain, an input of the control signal register chain coupled to a serial data output of the serial test interface logic, an output of each control signal register coupled to control inputs of the multiplexing logic.

30. The system of clause 29, wherein one of the control signal registers is configured to store a bit indicating whether the soft-repair mode is selected or the hard-repair mode is selected.

Alternative embodiments will become apparent to one of ordinary skill in the art to which the invention pertains. Therefore, although selected aspects have been illustrated and described in detail, it will be understood that various substitutions and alterations may be made therein.

What is claimed is:

1. A system for repairing a random access memory, comprising:

serial test interface logic;

fuse-sense logic;

a repair data register chain comprising a plurality of serially interconnected data registers configured to shift data serially through the repair data register chain, each data register of the repair data register chain having a data output configured to be coupled to a repair information input of the random access memory;

multiplexing logic configured to provide a soft-repair mode and a hard-repair mode, the multiplexing logic configured to selectably receive into the data registers soft-repair data provided by the serial test interface logic when the soft-repair mode is selected or hard-repair data provided by the fuse-sense logic when the hard-repair mode is selected;

a control signal register chain comprising a plurality of serially interconnected control signal registers configured to shift data serially through the control signal register chain, an input of the control signal register chain coupled to a serial data output of the serial test interface logic, an output of each control signal register coupled to control inputs of the multiplexing logic; and a control signal register chain comprising a plurality of serially interconnected control signal registers configured to shift data serially through the control signal register chain, an input of the control signal register chain coupled to a serial data output of the serial test interface logic, an output of each control signal register coupled to control inputs of the multiplexing logic.

2. The system of claim 1, wherein the serial test interface logic comprises Joint Test Action Group (JTAG) logic.

3. The system of claim 1, wherein the multiplexing logic comprises a first plurality of multiplexers corresponding to the plurality of data registers, each multiplexer of the first plurality of multiplexers having an output coupled to a data input of the corresponding data register, each multiplexer of the first plurality of multiplexers having a first input configured to receive a portion of the hard-repair data provided by the fuse-sense logic and a second input configured to receive a portion of the soft-repair data.

4. The system of claim 3, wherein the second input of a first multiplexer of the first plurality of multiplexers is coupled to a serial data output of the serial test interface logic, and the second input of each other multiplexer of the first plurality of multiplexers is coupled to the data output of one of the data registers.

5. The system of claim 4, further comprising a second plurality of multiplexers corresponding to the plurality of data registers, a first input of each multiplexer of the second plurality of multiplexers coupled to the fuse-sense logic, a second input of each multiplexer of the second plurality of multiplexers coupled to the data output of the corresponding data register, and an output of each multiplexer of the second plurality of multiplexers coupled to the first input of a multiplexer of the first plurality of multiplexers.

6. The system of claim 1, further comprising a clock multiplexer configured to selectably couple to a clock input of each data register a serial test interface clock signal when the soft-repair mode is selected or a functional clock signal when the hard-repair mode is selected.

7. The system of claim 1, wherein the serial test interface logic, the fuse-sense logic, the repair data register chain, and the multiplexing logic are included in a system-on-a-chip (SoC).

8. A system for repairing a random access memory, comprising:

means for receiving a mode selection signal indicating a soft-repair mode or a hard-repair mode;

means for reading soft-repair data from serial test interface logic into a repair data register chain via multiplexing logic in response to the mode selection signal indicating the soft-repair mode, the repair data register chain comprising a plurality of serially interconnected data registers;

means for reading hard-repair data from fuse-sense logic into the repair data register chain via the multiplexing logic in response to the mode selection signal indicating the hard-repair mode;

means for providing repair information from outputs of the data registers to a repair information input of the random access memory;

means for transferring data serially from the serial test interface logic into a control signal register chain comprising a plurality of serially interconnected control signal registers; and means for coupling outputs of the control signal registers to control inputs of the multiplexing logic.

9. The system of claim 8, wherein the serial test interface logic comprises Joint Test Action Group (JTAG) logic.

10. The system of claim 8, wherein:

The means for reading hard-repair data comprises means for providing a portion of the hard-repair data to a first input of each multiplexer of a first plurality of multiplexers corresponding to the plurality of data registers; and The means for reading soft-repair data comprises means for providing a portion of the soft-repair data to a second input of each multiplexer of the first plurality of multiplexers.

11. The system of claim 10, wherein the means for providing the portion of the soft-repair data comprises:

means for coupling a serial data output of the serial test interface logic to the second input of a first multiplexer of the first plurality of multiplexers; and means for coupling outputs of the data registers to the second input of each other multiplexer of the first plurality of multiplexers.

12. The system of claim 11, further comprising:

means for coupling a first input of each multiplexer of a second plurality of multiplexers to the fuse-sense logic, the second plurality of multiplexers corresponding to the plurality of data registers; and means for coupling a second input of each multiplexer of the second plurality of multiplexers to the output of the corresponding data register.

13. The system of claim 8, further comprising:

means for coupling a serial test interface clock signal to a clock input of each data register when the soft-repair mode is selected; and means for coupling a functional clock signal to the clock input of each data register when the hard-repair mode is selected.

14. A method for repairing a random access memory, comprising:

receiving a mode selection signal indicating a soft-repair mode or a hard-repair mode;

reading soft-repair data from serial test interface logic into a repair data register chain via multiplexing logic in response to the mode selection signal indicating the soft-repair mode, the repair data register chain comprising a plurality of serially interconnected data registers;

reading hard-repair data from fuse-sense logic into the repair data register chain via the multiplexing logic in response to the mode selection signal indicating the hard-repair mode;

providing repair information from outputs of the data registers to a repair information input of the random access memory;

transferring data serially from the serial test interface logic into a control signal register chain comprising a plurality of serially interconnected control signal registers; and coupling outputs of the control signal registers to control inputs of the multiplexing logic.

15. The method of claim 14, wherein the serial test interface logic comprises Joint Test Action Group (JTAG) logic.

16. The method of claim 14, wherein:

reading hard-repair data comprises providing a portion of the hard-repair data to a first input of each multiplexer of a first plurality of multiplexers corresponding to the plurality of data registers; and reading soft-repair data comprises providing a portion of the soft-repair data to a second input of each multiplexer of the first plurality of multiplexers.

17. The method of claim 16, wherein providing the portion of the soft-repair data comprises:

coupling a serial data output of the serial test interface logic to the second input of a first multiplexer of the first plurality of multiplexers; and coupling outputs of the data registers to the second input of each other multiplexer of the first plurality of multiplexers.

18. The method of claim 17, further comprising:

coupling a first input of each multiplexer of a second plurality of multiplexers to the fuse-sense logic, the second plurality of multiplexers corresponding to the plurality of data registers; and coupling a second input of each multiplexer of the second plurality of multiplexers to the output of the corresponding data register.

19. The method of claim 14, further comprising:

coupling a serial test interface clock signal to a clock input of each data register when the soft-repair mode is selected; and coupling a functional clock signal to the clock input of each data register when the hard-repair mode is selected.

20. The method of claim 14, wherein the method is performed in a system-on-a-chip (SoC).

21. A system-on-a-chip (SoC) having a system for repairing a random access memory, comprising:

fuse-sense logic on the SoC;

serial test interface logic on the SoC, the serial test interface logic comprising Joint Test Action Group (JTAG) logic;

a repair data register chain on the SoC, the repair data register chain comprising a plurality of serially interconnected data registers configured to shift data serially through the repair data register chain, each data register of the repair data register chain having a data output configured to be coupled to a repair information input of the random access memory;

multiplexing logic on the SoC, the multiplexing logic configured to provide a soft-repair mode and a hard-repair mode, the multiplexing logic configured to selectably receive into the data registers soft-repair data provided by the serial test interface logic when the soft-repair mode is selected or hard-repair data provided by the fuse-sense logic when the hard-repair mode is selected; and a control signal register chain comprising a plurality of serially interconnected control signal registers configured to shift data serially through the control signal register chain, an input of the control signal register chain coupled to a serial data output of the serial test interface logic, an output of each control signal register coupled to control inputs of the multiplexing logic.

22. The system of claim 21, wherein the multiplexing logic comprises a first plurality of multiplexers corresponding to the plurality of data registers, each multiplexer of the first plurality of multiplexers having an output coupled to a data input of the corresponding data register, each multiplexer of the first plurality of multiplexers having a first input configured to receive a portion of the hard-repair data provided by the fuse-sense logic and a second input configured to receive a portion of the soft-repair data.

23. The system of claim 22, wherein the second input of a first multiplexer of the first plurality of multiplexers is coupled to a serial data output of the serial test interface logic, and the second input of each other multiplexer of the first plurality of multiplexers is coupled to the data output of one of the data registers.

24. The system of claim 23, further comprising a second plurality of multiplexers corresponding to the plurality of data registers, a first input of each multiplexer of the second plurality of multiplexers coupled to the fuse-sense logic, a second input of each multiplexer of the second plurality of multiplexers coupled to the data output of the corresponding data register, and an output of each multiplexer of the second plurality of multiplexers coupled to the first input of a multiplexer of the first plurality of multiplexers.

25. The system of claim 21, further comprising a clock multiplexer configured to selectably couple to a clock input of each data register a serial test interface clock signal when the soft-repair mode is selected or a functional clock signal when the hard-repair mode is selected.

26. The system of claim 21, wherein one of the control signal registers is configured to store a bit indicating whether the soft-repair mode is selected or the hard-repair mode is selected.

* * * * *